United States Patent [19]
Dearth et al.

[11] Patent Number: 5,812,824
[45] Date of Patent: Sep. 22, 1998

[54] METHOD AND SYSTEM FOR PREVENTING DEVICE ACCESS COLLISION IN A DISTRIBUTED SIMULATION EXECUTING IN ONE OR MORE COMPUTERS INCLUDING CONCURRENT SIMULATED ONE OR MORE DEVICES CONTROLLED BY CONCURRENT ONE OR MORE TESTS

[75] Inventors: Glenn A. Dearth, Groton; Paul M. Whittemore, Marlborough, both of Mass.

[73] Assignee: Sun Microsystems, Inc., Palo Alto, Calif.

[21] Appl. No.: 621,818

[22] Filed: Mar. 22, 1996

[51] Int. Cl.$^6$ ..................................................... G06F 15/00
[52] U.S. Cl. .......................... 395/500; 370/411; 370/412; 395/726
[58] Field of Search .................................... 395/726–732, 395/920, 500, 650, 200.31, 200.32, 200.33, 200.36, 200.37; 364/578, 488–491; 370/412, 411, 413

[56] References Cited

U.S. PATENT DOCUMENTS

| | | | |
|---|---|---|---|
| 5,283,896 | 2/1994 | Temmyo et al. | 395/650 |
| 5,371,893 | 12/1994 | Price et al. | 395/725 |
| 5,375,074 | 12/1994 | Greenberg et al. | 364/578 |

OTHER PUBLICATIONS

Hermannsson et al. ("Optimistic synchronization in distributed shared memory", IEEE Comput. Soc. Press, 1994, Proceedings of the 14th International Conference on Distributed Computing Systems, 21–24 Jun. 1994, pp. 345–354).

Chang et al. ("A Fault–Tolerant Triangular Mesh Protocol for Distributed Mutual Exclusion", IEEE Comput. Soc. Press, 1995, Seventh Proceedings of IEEE Symposium on Parallel and Distributed Processing, 25–28 Oct. 1995, pp. 694–701).

*Primary Examiner*—Emanuel Todd Voeltz
*Assistant Examiner*—Vuthe Siek
*Attorney, Agent, or Firm*—James D. Ivey

[57] ABSTRACT

Collisions in access to a simulated device are avoided by reserving to one of two or more hardware simulation tests the simulated device. Deadlocks involving requests of multiple tests for reservation of devices are prevented by establishing the order in which such requests are served and requiring that a test must first relinquish reservation of all devices prior to reserving additional devices. Thus, when the additional requests are appended to a queue of pending reservation requests, no test whose requests follow the requests of a second test in the queue can reserve a device requested by the second test. In other words, the situation in which each of two or more tests has reserved a device, reservation of which is required by another of the two or more tests, cannot occur. Starvation is prevented by combining the sorted queue of each reservation phase into a sorted "round robin" arrangement. Specifically, each collection of requests of a reservation phase are sorted into a request arrival queue and, when the request arrival queue includes all requests of a particular reservation phase, the request arrival queue is appended to the pending request queue. Thus, the lowest priority request of a particular reservation phase of requests is given higher priority than the highest priority request of a subsequent reservation phase. In addition, repeatability of reservation request arbitration is achieved by sorting reservation requests in each request arrival queue according to the respective identifiers of the requesting tests.

18 Claims, 9 Drawing Sheets

METHOD AND SYSTEM FOR PREVENTING DEVICE ACCESS COLLISION IN A DISTRIBUTED SIMULATION EXECUTING IN ONE OR MORE COMPUTERS INCLUDING CONCURRENT SIMULATED ONE OR MORE DEVICES CONTROLLED BY CONCURRENT ONE OR MORE TESTS

CROSS-REFERENCE TO RELATED APPLICATIONS

The following copending U.S. Patent Applications are related to the present disclosure and the disclosures thereof are incorporated herein by reference: (i) a copending U.S. Patent Application for "Interface for Interfacing Simulation Tests Written in a High-Level Programming Language to a Simulation Model" by Glenn A. Dearth, Paul M. Whittemore, David A. Medeiros, George R. Plouffe, Jr., and Bennet H. Ih filed on Mar. 21, 1996 Ser. No. 08/620,439 hereinafter the "Interface Application"), (ii) a copending U.S. Patent Application for "Virtual Bus for Distributed Hardware Simulation" by Glenn A. Dearth and Paul M. Whittemore filed on Mar. 21, 1996 Ser. No. 08/621,775 hereinafter the "Virtual Bus Application"), (iii) a copending U.S. Patent Application for "Deadlock Avoidance Mechanism for Virtual Bus Distributed Hardware Simulation" by Glenn A. Dearth filed on Mar. 21, 1996 Ser. No. 08/621,777 hereinafter the "Deadlock Avoidance Application"Application for "Object-Oriented Development Framework for Distributed Hardware Simulation" by Bennet Ih and Glenn A. Dearth filed on Mar. 21, 1996 Ser. No. 08/621,776 hereinafter the "Framework Application"), and (v) a copending U.S. Patent Application for "Synchronization Mechanism for Distributed Hardware Simulation" by Paul M. Whittemore and Glenn A. Dearth filed on Mar. 21, 1996 Ser. No. 08/621,816 hereinafter the "Synchronization Application").

FIELD OF THE INVENTION

The present invention relates to computer simulation of electronic circuitry and, in particular, to a method and apparatus for arbitrating multiple, simultaneous requests for access to a simulation resource which simultaneously prevents access collisions, deadlock situations, and starvation situations in simulation of complex circuitry using models which can be distributed over a computer network.

BACKGROUND OF THE INVENTION

In designing complex circuitry such as application-specific integrated circuits ("ASICs"), the designed logic of such circuitry is typically simulated in a computer using data and computer programs to thereby test the viability and accurate performance of the designed logic. By doing so, design flaws can be detected prior to expending the engineering and financial resources and time required to physically build the circuitry. To simulate circuitry using data and computer programs, the circuitry is described in a hardware description language ("HDL") to form a model. One example of an HDL is the Verilog HDL processed by the Cadence Verilog hardware simulator available from Cadence Design Systems, Inc. of San Jose, California. The HDL model of a circuit typically includes a description of components of the state of the circuit and a description of the behavior of the circuit. The behavior of the circuit generally includes interrelationships between various components of the state of the circuit.

A hardware simulator then uses the HDL model of the circuitry to simulate the circuitry. The hardware simulator is a computer process which accepts data defining simulated signals to be placed on certain parts of the simulated circuit and then changes the state of the circuit in accordance with the simulated signals. The certain parts of the circuit include, for example, terminals, lines, or registers of the simulated circuit.

Circuitry which is simulated in this manner is becoming increasingly complex; therefore, simulation of such circuitry on a single computer processor is becoming less feasible. Specifically, simulations of particularly complex circuits require intolerable amounts of time and computer resources to execute. The Interface Application describes a mechanism by which a complex circuit is divided into multiple circuit parts and by which the circuit parts are simulated by individual models which can execute on multiple constituent computers of a computer network.

In addition, the mechanism described in the Interface Application permits multiple tests of the simulated circuit to execute concurrently. A test of a simulated circuit is a series of computer instructions and data which collectively define simulated signals to be placed at particular locations within the simulated circuit and simulated signals to be sampled at other particular locations within the simulated circuit. For example, a test can include computer instructions which direct (i) that a specific simulated signal is stored within a specific register of the simulated circuit, (ii) that the circuit is simulated for a number of cycles of a simulated clock signal, and (iii) that a resulting simulated signal is retrieved from a second register of the simulated circuit.

When simulating a circuit according to multiple, concurrently executing tests, it is possible that more than one test attempts to interact with the same simulated component of the simulated circuit. For example, two tests may attempt to write to the same register of the simulated circuit simultaneously. Such simultaneous interactions can produce erroneous states of the simulated circuit and, therefore, erroneous test results. In conventional circuit simulators, interaction between a simulated circuit component and multiple tests simultaneously is not a concern since multiple tests and the simulated circuit are implemented in single computer process and, accordingly, no two tests simultaneously access a component of the simulated circuit.

Without automatic access arbitration, a test design engineer who configures the multiple tests described above would have to include, in the computer instructions and data of each test, implementation of a protocol by which multiple simultaneous attempted interactions with a particular component of the simulated circuit are arbitrated. However, such exacerbates the complexity of the task performed by the test design engineer and is an impractical solution given the typical development process for such tests. In particular, a test design engineer typically designs each test of a simulated circuit individually without consideration of other tests that may be previously or subsequently developed for testing the simulated circuit. Each test is executed individually to test a particular function of the simulated circuit. Then, after multiple tests have been developed, the multiple tests are executed concurrently to simulate a pseudo-random set of transactions with the simulated circuit. Therefore, to avoid test collisions, i.e., simultaneous interaction with a component of the simulated circuit by multiple tests, the test design engineer must faithfully and accurately implement a relatively complex access arbitration mechanism in designing each individual test while considering the potential behavior of all other tests that have been or will be developed for the simulated circuit. Such significantly increases the difficulty of the task performed by the test design engineer.

In any arbitration of simultaneous access to a particular component of the simulated circuit, there are generally two potential problems, namely, deadlock and starvation. Deadlock refers to a situation in which two or more tests are waiting for each other to relinquish ownership or reservation of a particular component of the simulated circuit. Consider the following illustrative example. Test A and test B each need reservation of components C and D of a simulated circuit to continue execution. As used herein, reservation of a device or component by a test refers to acquisition of access, which is exclusive with respect to other tests, to that device or component. Test A has reserved component C, and test B has reserved component D. Test A will not continue execution and will not relinquish the reservation of component C until test A successfully reserves component D. Conversely, test B will not continue execution and will not relinquish the reservation of component D until test B successfully reserves component C. Therefore, tests A and B are deadlocked and neither will continue to execute or will relinquish any reserved components. Deadlock is a catastrophic error and must be avoided for tests to successfully execute.

Starvation refers to a test waiting an exceedingly long period of time to acquire reservation of requisite components of a simulated circuit before executing. Starvation is more prominent in priority-based systems. A test which has a low priority may not acquire reservation of a requisite component of a simulated circuit until all higher priority tests have completed execution. Starvation is not a catastrophic error but significantly reduces the performance of a system performing multiple simultaneous tests and reduces the effectiveness with which multiple concurrently executing tests simulate a pseudo-random set of transactions with the simulated circuit.

An arbitration mechanism for access to components of a simulated circuit must also be repeatable. Repeatability of a test or of a combination of tests refers to consistency in the results of such tests in multiple executions of such test or combination of tests without changes in the design of the simulated circuit or the simulated signals to be applied to the simulated circuit. Without repeatability, tracking the execution of the one or more tests and the various circuit parts of the simulated circuit to analyze the tests and/or the simulated circuit to detect design errors becomes extremely difficult and complex.

In addition to arbitration of access to components of the simulated circuit, routing of messages from components of a simulated circuit to various tests of the simulated circuit can be a difficult problem. For example, a component of a simulated circuit can produce a resulting state in response to simulated signals placed in another component of the simulated circuit by a specific one of the various tests of the simulated circuit and can be programmed to send a message including data representing the resulting state to the specific test. However, models of the various circuit parts generally do not have information regarding the test from which simulated signals are sent to the component.

What is needed is an efficient, repeatable arbitration mechanism for access to various components of a simulated circuit by multiple concurrently executing tests of the simulated circuit. What is further needed is an efficient mechanism by which messages from various circuit parts of a simulated circuit are automatically routed to the test from which simulated signals are received by the circuit part.

SUMMARY OF THE INVENTION

In accordance with the present invention, deadlocks involving requests of multiple tests for reservation of devices are prevented by establishing the order in which such requests are served and requiring that a test must first relinquish reservation of all devices prior to requesting reservation of additional devices. Thus, when the additional requests are appended to a queue of pending reservation requests, no test whose requests follow the requests of a second test in the queue can reserve a device requested by the second test. In other words, the situation in which each of two or more tests reserves a device, reservation of which is required by another of the two or more tests, cannot occur. Therefore, deadlocks are prevented.

Starvation is prevented by combining the sorted queue of each request round into a sorted round-robin arrangement. Specifically, each collection of requests of a single reservation phase are sorted into a request arrival queue and, when the request arrival queue includes all requests of a particular reservation phase, the request arrival queue is appended to the pending request queue. Thus, the lowest priority request of a particular reservation phase is given higher priority than the highest priority request of a subsequent reservation phase. In addition, repeatability of reservation request arbitration is achieved by sorting reservation requests in each request arrival queue according to the respective identifiers of the requesting tests. In other words, the requests of each reservation phase are sorted to ensure that the request arbitration is completely repeatable, and the requests of each reservation phase are appended to an existing pending request queue to ensure that no request of a particular reservation phase is served prior to any request of a previous reservation phase.

The present invention therefore provides a relatively simple, yet effective, access arbitration mechanism in which deadlock and starvation in serving device reservation requests of multiple, concurrently executing tests are prevented and in which arbitration of such multiple reservation requests is completely repeatable to facilitate analysis of tests and circuit simulations.

DETAILED DESCRIPTION

In accordance with the present invention, tests which require access to one or more devices of a simulated circuit must first request and be granted reservation of those devices. By reserving of a device of a simulated circuit, the test prevents reservation of the device by other tests and can therefore interact with the device without interference with the interaction by another test. Reservation requests are granted in a modified round robin system in which requests of each round, i.e., of each reservation phase of the operating cycle of the simulation of the simulated circuit, are prioritized to ensure repeatability. Once a test has requested reservation of one or more devices of a simulated circuit, the test cannot request reservation of additional devices until each of the previously requested one or more devices has been reserved and released by the test. When a test releases a device, the test relinquishes the reservation of the device. Strict enforcement of this requirement ensures deadlocks cannot occur as described more completely below. When a test's request for reservation of a device of the simulated circuit is granted, an entry is recorded in a routing table to indicate that the test has reserved the device. Accordingly, messages from any device of the simulated circuit can be easily and efficiently routed to the test which is currently interacting with the device.

Hardware Operating Environment

Figure 1:
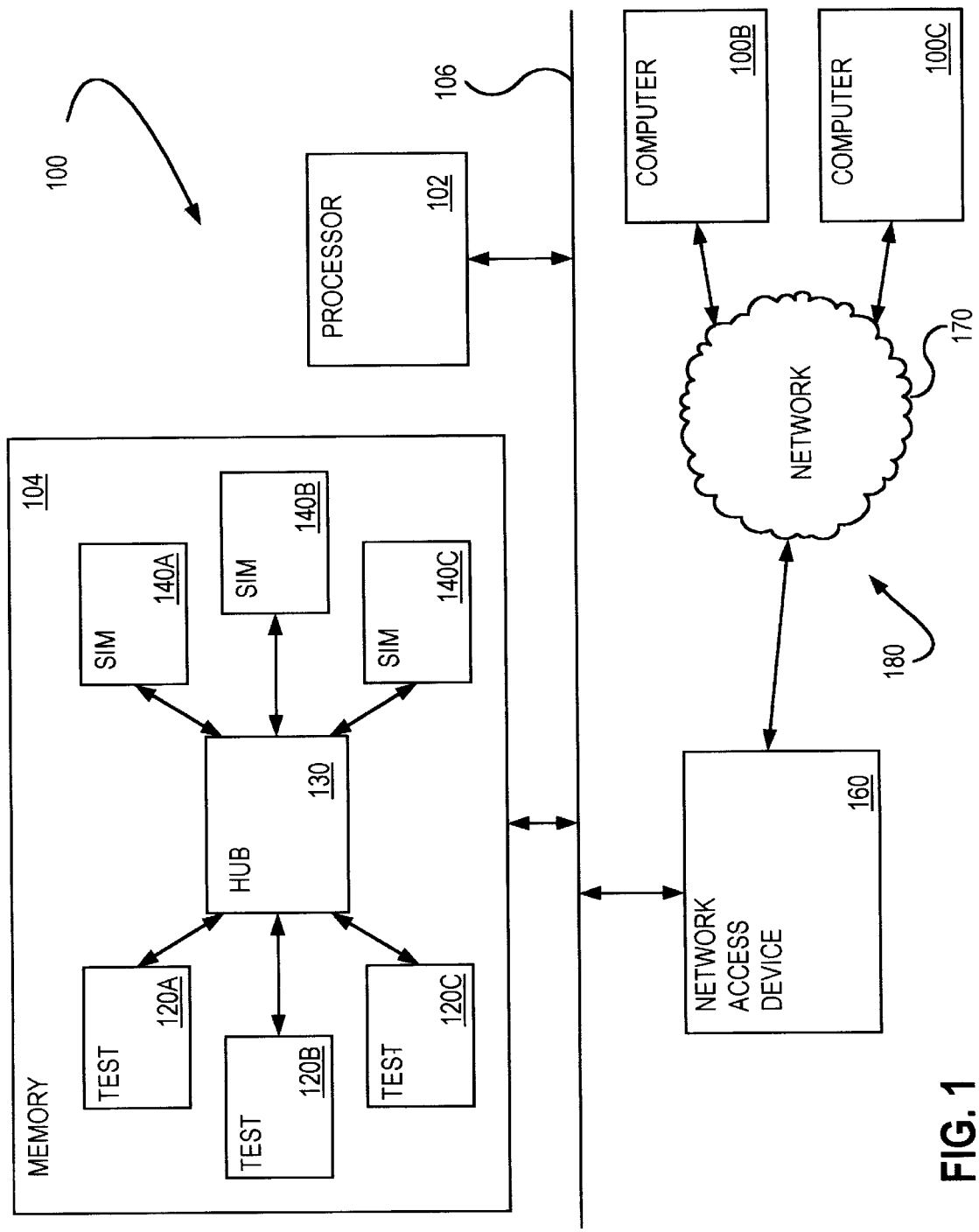
FIG. 1 is a block diagram of a computer network and a distributed simulation which includes a hub, a number of simulation systems which collectively simulate a circuit, and a number of tests which control the simulation of the simulated circuit.

To facilitate an appreciation of the present invention, the operating environment of the described embodiment is described briefly. FIG. 1 shows computers 100, 100B, and 100C connected to one another through a network 170 to form a computer network 180. Each of computers 100, 100B, and 100C are directly analogous to one another, and the following description of computer 100 is therefore equally applicable to computers 100B–C, except as otherwise noted.

Computer 100 includes a processor 102 which fetches computer instructions from a memory 104 through a bus 106 and executes those computer instructions. In executing computer instructions fetched from memory 104, processor 102 can retrieve data from or write data to memory 104, display information on one or more computer display devices (not shown), receive command signals from one or more user-input devices (not shown), or transfer data to computer 100B or computer 100C through network 170. Processor 102 can be, for example, any of the SPARC processors available from Sun Microsystems, Inc. of Mountain View, Calif. Memory 104 can include any type of computer memory including, without limitation, randomly accessible memory (RAM), read-only memory (ROM), and storage devices which include magnetic and optical storage media such as magnetic or optical disks. Computer 100 can be, for example, any of the SPARCstation workstation computer systems available from Sun Microsystems, Inc. of Mountain View, Calif.

Computer 100 also includes a network access device 160, through which computer 100 is coupled to network 170. Network access device 160, in accordance with control signals received from processor 102, cooperates with a network access device (not shown) of computer 100B or computer 100C to transfer data through network 170. The transfer of data between network access devices of computers 100, 100B, and 100C is conventional and well-known. Network access device 160 can be generally any circuitry which is used to transfer data between computer 100 and network 170 and can be, for example, an Ethernet controller chip or a modem.

Sun, Sun Microsystems, and the Sun Logo are trademarks or registered trademarks of Sun Microsystems, Inc. in the United States and other countries. All SPARC trademarks are used under license and are trademarks of SPARC International, Inc. in the United States and other countries. Products bearing SPARC trademarks are based upon an architecture developed by Sun Microsystems, Inc.

Tests 120A–C, hub 130, and simulation systems 140A–C are computer processes executing in processor 102 from memory 104. Tests 120A–C and simulation systems 140A–C are described more completely in the Interface Application and that description is incorporated herein in its entirety by reference. Through hub 130, each of a number of tests interacts with any of a number of simulation systems to simulate multiple, concurrent transactions with a simulated circuit. The number of tests includes tests 120A–C and other tests which are directly analogous to tests 120A–C which execute within computers 100 and 100–C. Similarly, the number of simulation systems includes simulation systems 140A–C and other simulation systems which are directly analogous to simulation systems 140A–C which execute within computers 100 and 100B–C. Only one hub can control transactions between the tests and simulation systems; therefore, no hubs which are analogous to hub 130 execute within either of computers 100B–C. While hub 130 is shown in FIG. 1 to be executing in a computer in which a number of tests and simulation systems execute, it should be noted that each of the processes shown to be executing in computer 100 can be distributed to other computers of computer network 180. For example, hub 130 can execute in a computer of computer network 180 in which no tests or simulation systems execute. Similarly, a test can execute in a computer in which neither hub 130 nor any simulation systems execute, and a simulation system can execute in a computer in which neither hub 130 nor any test execute. In accordance with the present invention, each of tests 120A–C processes according to logic flow diagram 200 (FIG. 2) in which processing begins in loop step 202.

In loop step 202, in conjunction with next step 214, defines a loop in which steps 204–212 are performed repeatedly until processing of the subject test, i.e., the one of tests 120A–C (FIG. 1) performing the steps of logic flow diagram 200 (FIG. 2) is completed. Completion of the processing of the subject is defined by the particular computer instructions and data which define the test as configured by a test design engineer. For each iteration of the loop defined by loop step 202 and next step 214, processing transfers from loop step 202 to step 204.

In step 204, the subject test requests of hub 130 (FIG. 1) reservation of one or more devices to which the subject test requires access to continue processing according to the particular design of the subject test. As used herein, a device is a component of a simulated circuit and is capable of interaction through hub 130 with one or more of tests 120A–C or with any test of computers 100, 100B, or 100C. For example, a device can be any of transactors 15 of FIG. 1 of the Interface Application. From step 204 (FIG. 2), processing transfers to step 206 in which the subject test sleeps, i.e., execution of the subject test is suspended.

While the subject test sleeps, hub 130 (FIG. 1) arbitrates all requests for reservation of various devices in a manner described more completely below. When the subject test is granted reservation of all reserved devices, hub 130 signals the subject test to awaken, i.e., to resume execution. When the subject test is awaken as represented by arrow 208 (FIG. 2), processing continues in step 210.

In step 210, the subject test continues execution in accordance with the particular design and configuration of the subject test as implemented by a test design engineer. Such processing can include interaction with any of the devices now reserved by the subject test. For example, the subject test can write to a reserved device simulated signals and can sample from a reserved device simulated signals. When the subject test no longer needs the reserved devices, or when the subject test requires reservation of a device which is not reserved by the subject test, processing transfers from step 210 to step 212.

In step 212, the subject test relinquishes reservation of all devices reserved in step 204 by sending a message to hub 130 (FIG. 1) so requesting. Once the subject test has relinquished reservation of all devices, processing transfers from step 212 through next step 214 to loop step 202 from which another iteration of the loop defined by loop step 202 and next step 214 is processed. The subject test can then reserve a second set of devices in a subsequent performance of step 204. It is appreciated that the second set of devices can include devices reserved in a prior performance of step 204 and relinquished in a prior performance of step 212.

Data Structures for Arbitration of Device Reservations

Figure 3:
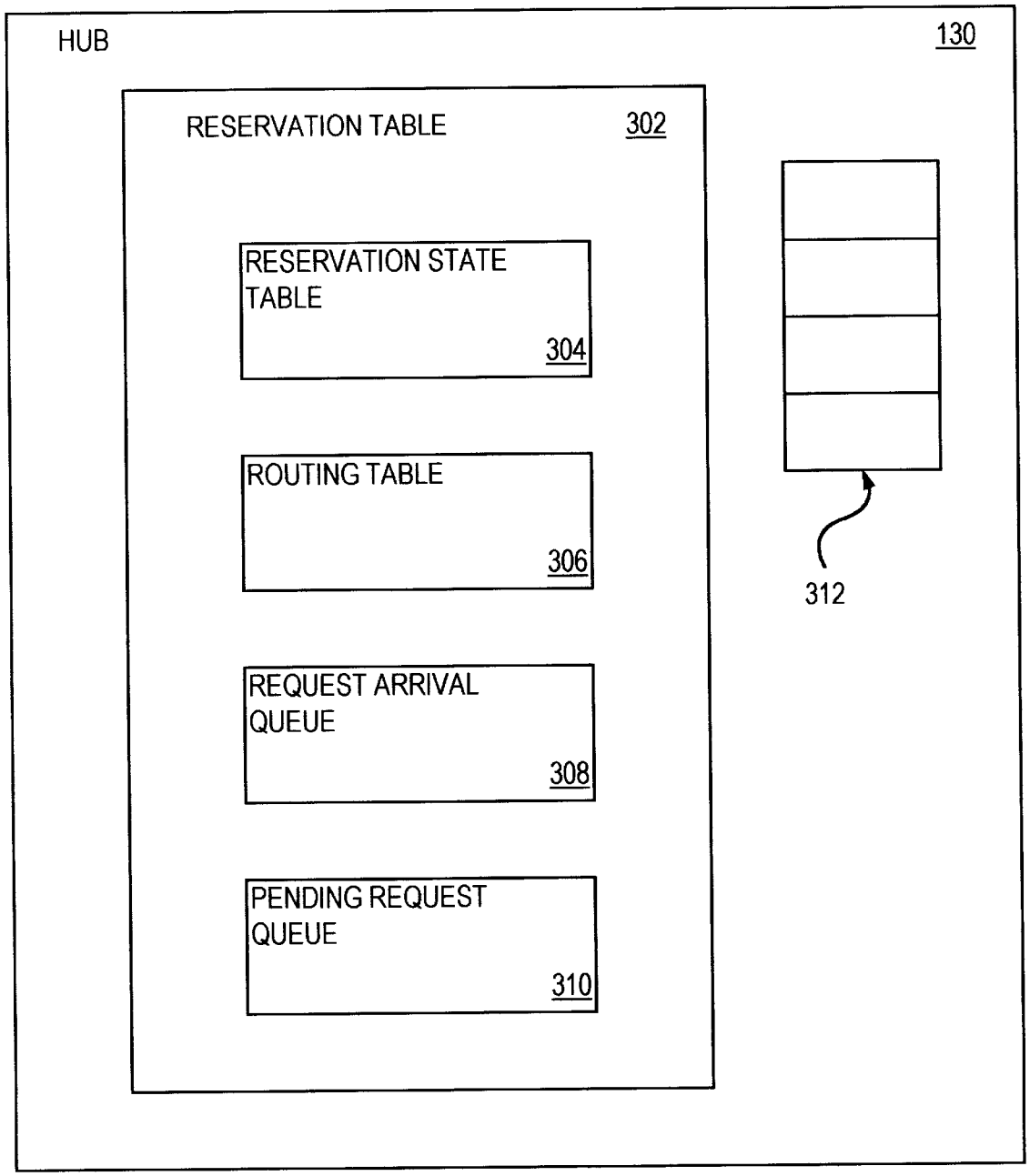
FIG. 3 is a block diagram of the hub of FIG. 1 in greater detail.
Figure 4:
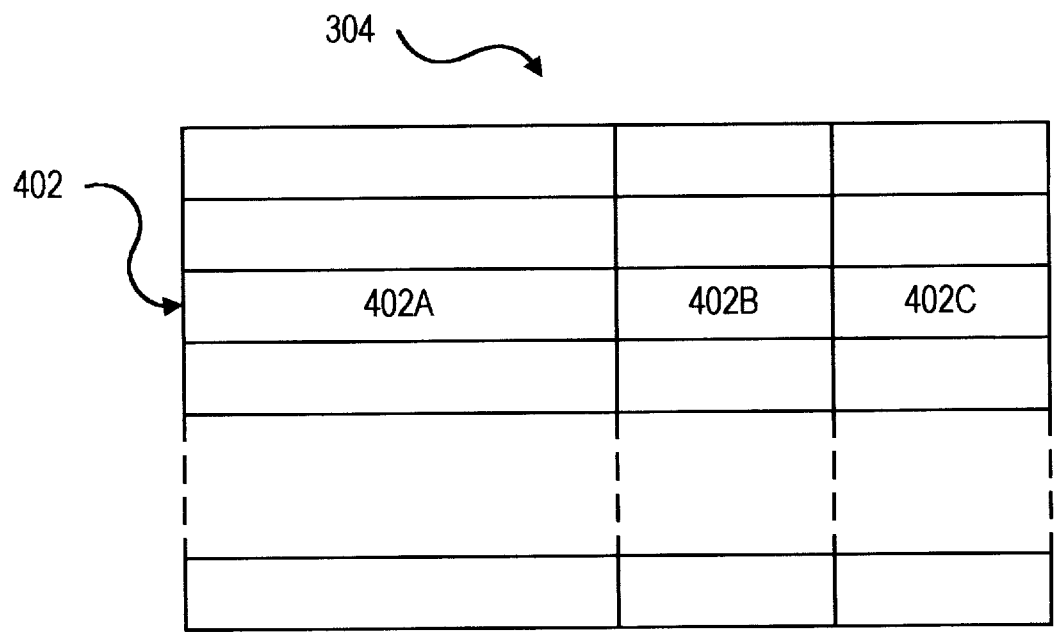
FIG. 4 is a block diagram of a reservation state table of the hub of FIG. 3.

For arbitration of device reservations by the one or more tests executing within computers 100 (FIG. 1), 100B, and 100C, hub 130 includes a reservation table 302 (FIG. 3). Reservation table 302 includes a reservation state table 304, a routing table 306, a request arrival queue 308, and a pending request queue 310. Reservation state table 304 records the reservation state of each test registered with hub 130. Each test which is to interact with a simulation system, e.g., any of simulation systems 140A–C (FIG. 1), through hub 130 must register with hub 130 by sending a registration message to hub 130 prior to interacting with a simulation system through hub 130. Registration messages are described more completely in the Interface Application and that description is incorporated herein by reference. For each registering test, hub 130 includes a record in reservation state table 304 (FIG. 3) which represents the reservation state of the registering test. Reservation state table 304 is shown in greater detail in FIG. 4.

Reservation state table 304 includes, for each test registered with hub 130, a reservation state record such as reservation state record 402. The reservation state records of reservation state table 304 are directly analogous to one another, and the following description of reservation state record 402 is equally applicable to all reservation state records of reservation state table 304.

Figure 2:
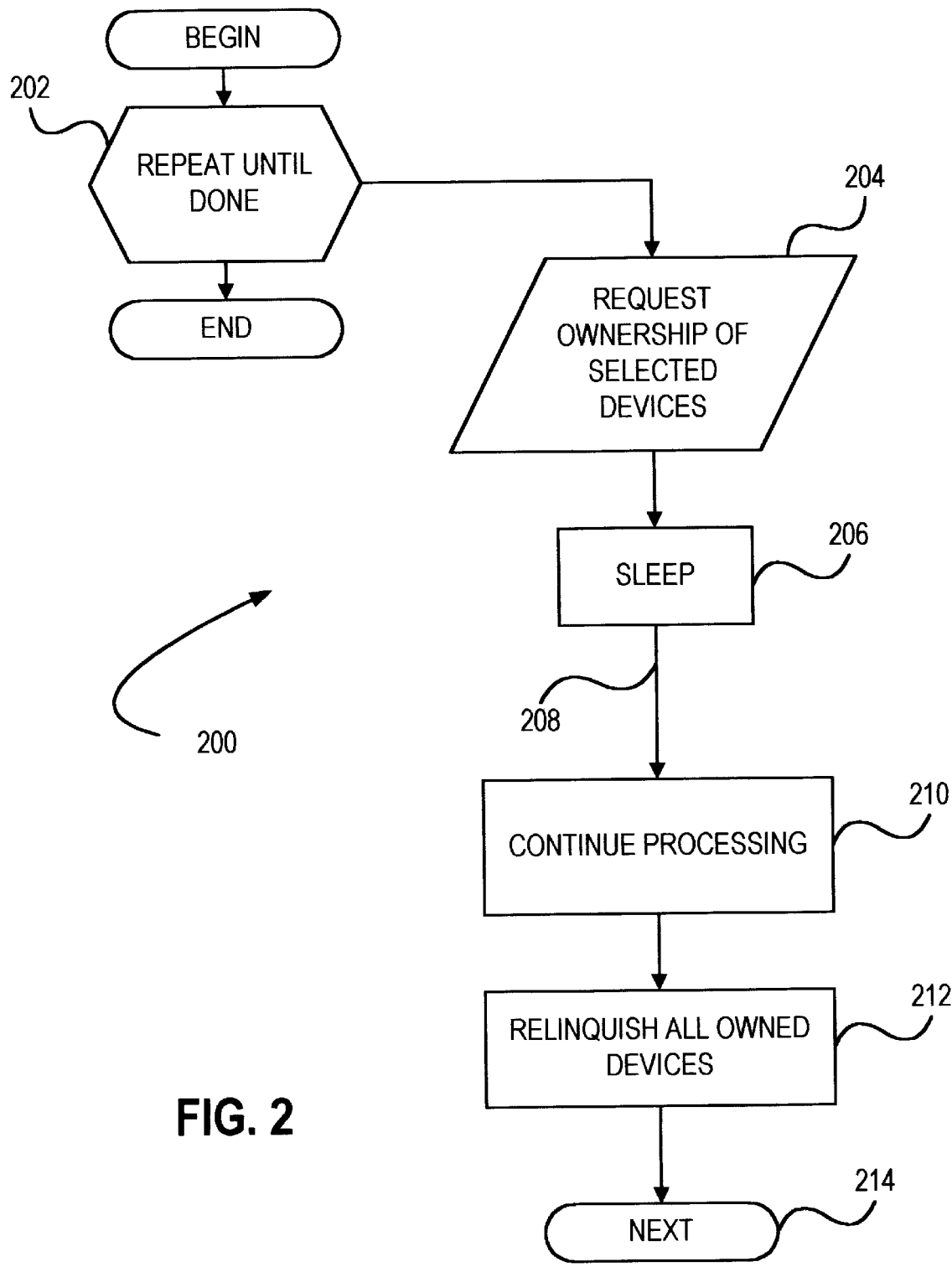
FIG. 2 is a logic flow diagram of the processing of a test of FIG. 1 in accordance with the present invention.

Reservation state record 402 includes a test identification field 402A, a reservation requests field 402B, and a reservations granted field 402C. As used herein, a field is a collection of data which collectively define a particular piece of information. Test identification field 402A contains data which uniquely identifies a particular one of the tests registered with hub 130, e.g., test 120A. Reservation requests field 402B contains data whose value represents the number of devices reserved by the particular test in the most recent performance of step 204 (FIG. 2). Reservations granted field 402C contains data whose value represents the number of devices currently reserved by the particular test. From the value of data stored in reservation requests field 402B and reservations granted field 402C, the reservation state of the particular test can be determined as shown in Table A below in which "req" refers to the value stored in reservation requests field 402B and in which "gnt" refers to the value stored in reservation granted field 402C.

TABLE A

| Relation Between Requested and Granted | Reservation State |
| --- | --- |
| req = gnt = 0 | No reservations pending. |
| req < gnt | Illegal state (error). |
| req > gnt | Reservations pending (n = req − gnt). |
| req = gnt > 0 | All reservations are granted. |

Figure 5:
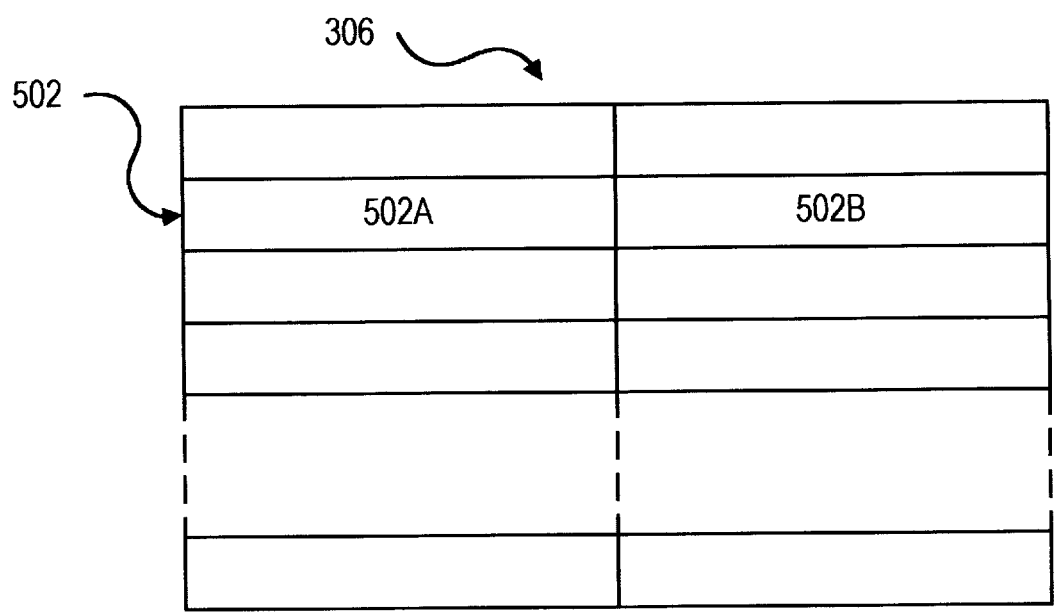
FIG. 5 is a block diagram of a routing table of the hub of FIG. 3.

Routing table 306 (FIG. 3) is used to record the reservation state of each device registered with hub 130 (FIG. 1). Each device of a simulation system, e.g., any of simulation systems 140A–C (FIG. 1), which is to interact through hub 130 with a test must register with hub 130 by sending a registration message to hub 130 prior to interacting with a test through hub 130. For each registering device, hub 130 includes a record in routing table 306 (FIG. 3) which identifies which test, if any, has reserved the registering device. Routing table 304 is shown in greater detail in FIG. 5.

Routing table 306 includes, for each device registered with hub 130, a routing record such as routing record 502. The routing records of routing table 306 are directly analogous to one another, and the following description of routing record 502 is equally applicable to all routing records of routing table 306. Routing record 502 includes a device identification field 502A and a test identification field 502B. Device identification field 502A contains data which uniquely identifies the particular device whose reservation state routing record 502 represents. Test identification field 502B contains data which uniquely identifies the particular test which currently has reserved the device, i.e., the particular test for which the device is reserved. If no test has reserved the device, test identification field 502B contains data which is not a valid test identification to so indicate. In one embodiment, valid test identifications are all positive integers and test identification field 502B contains data whose value is a non-positive integer to indicate that the device is not reserved.

Figure 6:
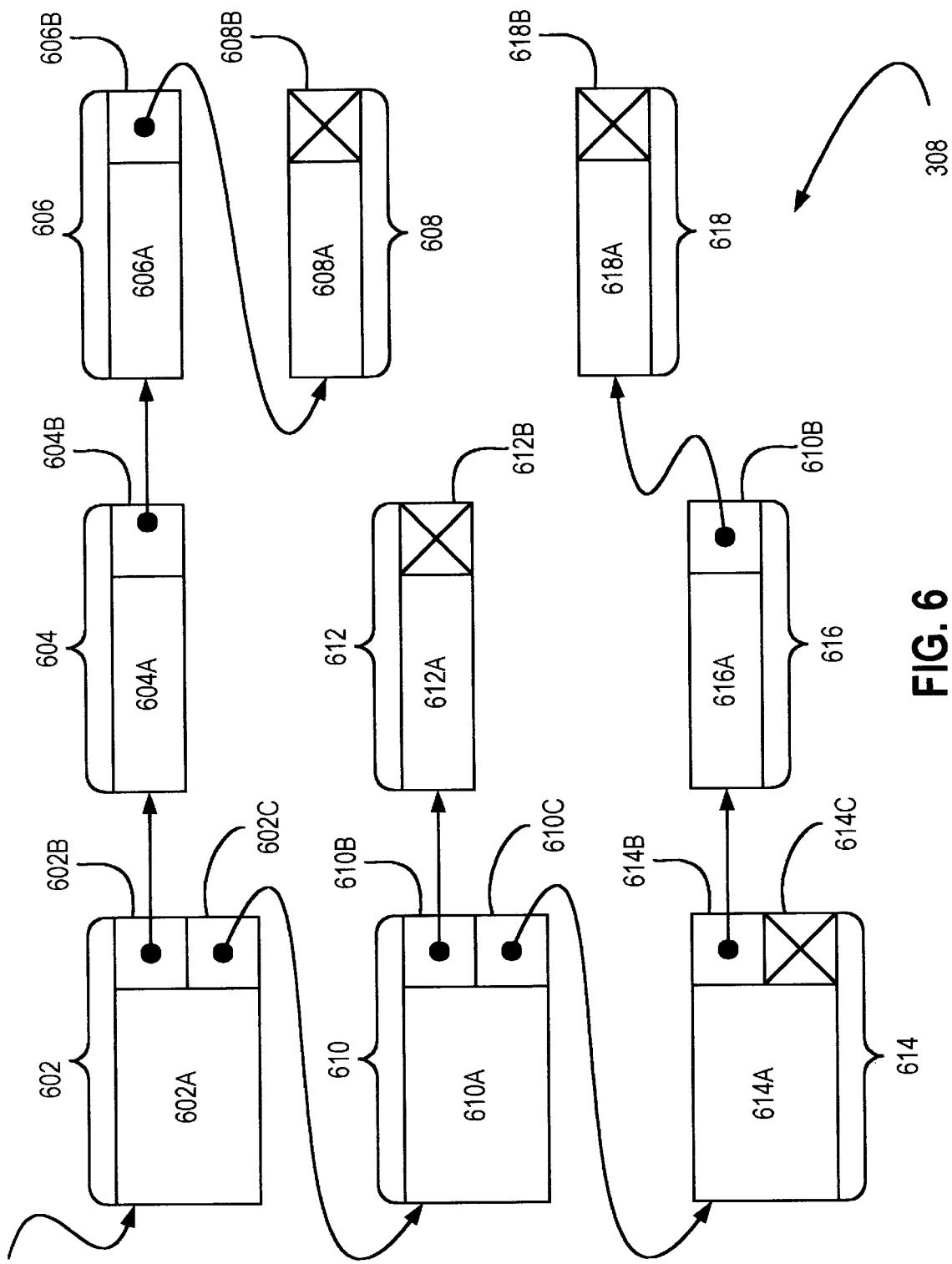
FIG. 6 is a block diagram of a request arrival queue of the hub of FIG. 3.

Request arrival queue 308 records new reservation requests posted by tests during each reservation cycle. A reservation cycle is a cycle in a synchronization cycle during which arbitration of reservation requests by various tests takes place. Reservation cycles, synchronization cycles, and reservation arbitration are described below in greater detail. Request arrival queue 308 is shown in greater detail in FIG. 6.

Request arrival queue 308 is a two-dimensional list in one embodiment. For example, request arrival queue 308 includes test records 602, 610, and 614. Each test record includes identification of a test and a pointer to a list of devices, reservation of which are requested by the test. For example, test record 602 includes a test identification field 602A, a request list pointer 602B, and a next test record pointer 602C. Test identification field 602A uniquely identifies a test which has registered with hub 130 for interaction with simulation systems, such as simulation systems 140A–C.

Next test record pointer 602C is a pointer to a test record whose position in request arrival queue 308 immediately follows the position of test record 602 in request arrival queue 308. For example, next test record pointer 602C points to test record 610. Therefore, test record 610 immediately follows test record pointer 602 in request arrival queue 308. Test record 614 is the last test record of request arrival queue 308. Accordingly, next test record pointer 614C of test record 614 is a NULL to indicate that no test record follows test record 614 in request arrival queue 308. A pointer is a field which uniquely identifies a data structure stored in memory 104 (FIG. 1). In one embodiment, a pointer is a field containing data whose value is an address in the address space of hub 130. A NULL is generally a value which is not a valid identification of a data structure in memory 104, e.g., is not a valid address in the address space of hub 130.

Request list pointer 602B of test record 602 is a pointer to a list of device records, each of which identifies a device, reservation of which is requested by the test represented by test record 602. For example, request list pointer 602B is a pointer to a list of device records 604, 606, and 608. Each device record includes a device identification field and a next device pointer. For example, device record 604 includes device identification field 604A and next device pointer 604B. Device identification field 604A uniquely identifies a device which has registered with hub 130 for interaction with tests, such as tests 120A–C. Next device pointer 604B is a pointer to another device record or is a NULL if no record pointer follows in the list of record pointers.

Figure 7:
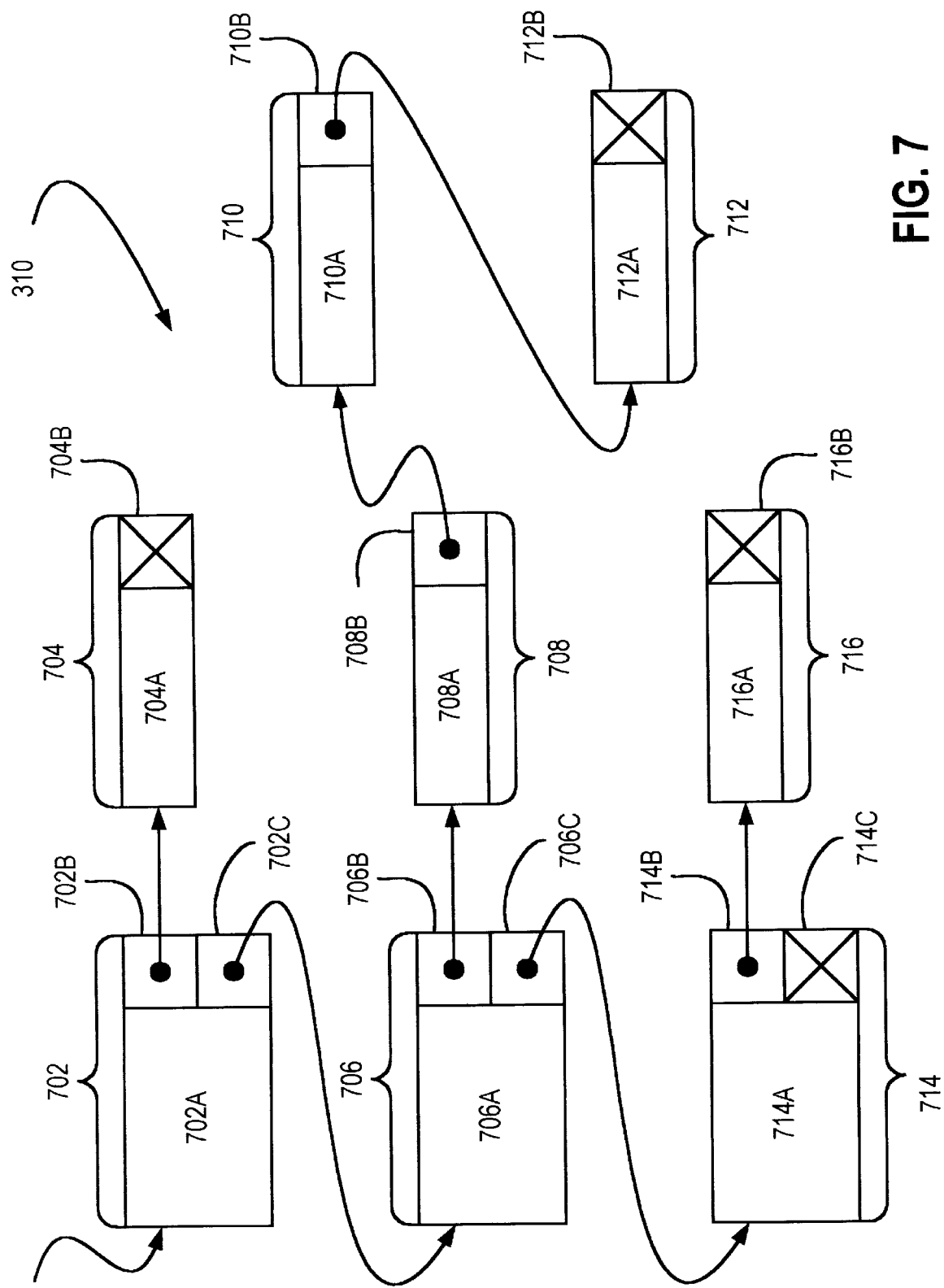
FIG. 7 is a block diagram of a pending request queue of the hub of FIG. 3.

Pending request queue 310 records reservations which hub 130 attempts to grant in a manner described more completely below. Pending request queue 310 is shown in greater detail in FIG. 7. The structure of pending request queue 310 is generally analogous to the structure of request arrival queue 308 (FIG. 6) as described above. One illustrative composition of pending request queue 310 is shown in FIG. 7, in which pending request queue 310 includes test records 702, 706, and 714 and device records 704, 708, 710, 712, and 716.

Arbitration of Device Reservations

As briefly described above, hub 130 (FIG. 1) arbitrates the reservation requests of the various tests of computer network 180 during a reservation phase of a synchronization phase of the simulation effected collectively by hub 130, tests such as tests 120A–C, and simulation systems such as simulation systems 140A–C. As described more completely in the Synchronization Application, which description is incorporated herein by reference, distributed simulations must generally be synchronized periodically. During such synchronization, each of the tests and simulation systems registered with hub 130 are brought to a common simulation time. Tests and simulation systems are generally brought to a common simulation time by suspending execution of the tests and simulation systems until each can be updated to a state corresponding to the common simulation time. Since execution of each of the tests and simulation systems is suspended during the synchronization phase, the synchronization phase is a convenient time to arbitrate various requests for reservation of various devices by various tests since hub 130 has sufficient information regarding the state of each test and each device and all states become simultaneously static at some point during the synchronization phase. Thus, as described more completely in the Synchronization Application, a reservation phase substantially immediately follows the synchronization phase.

Since all tests and simulation systems are allowed to progress to a common point in simulation time, each test is permitted to request all reservations in a particular reservation phase. In other words, from one iterative execution of the simulation of tests 120A–C (FIG. 1), hub 130, and simulation systems 140A–C to the next, the same tests will request reservation of the same devices in a particular reservation phase of each iterative execution of the simulation. Specifically, all requests for reservation of a device of a simulation system are received by hub 130 prior to the common point in simulation time and are stored on a received request queue 312 (FIG. 3). Each of tests 120A–C requests reservation of a device, generally prior to a synchronization phase, by sending to hub 130 a message which includes data identifying the device and data indicating that reservation of the device is requested. When a test has requested reservation of all devices which the test is to reserve, the test sends to hub 130 a message indicating that no further requests for reservation will be made prior to the next reservation phase. Since tests 120A–C are separate processes executing in computer 100, the particular order in which such reservations are requested prior to a given reservation phase can vary from one iterative execution of the simulation to the next. Thus, to ensure repeatability, the order in which reservation requests are served in a particular reservation phase must not vary according to the order in which such requests are received by hub 130.

Figure 8:
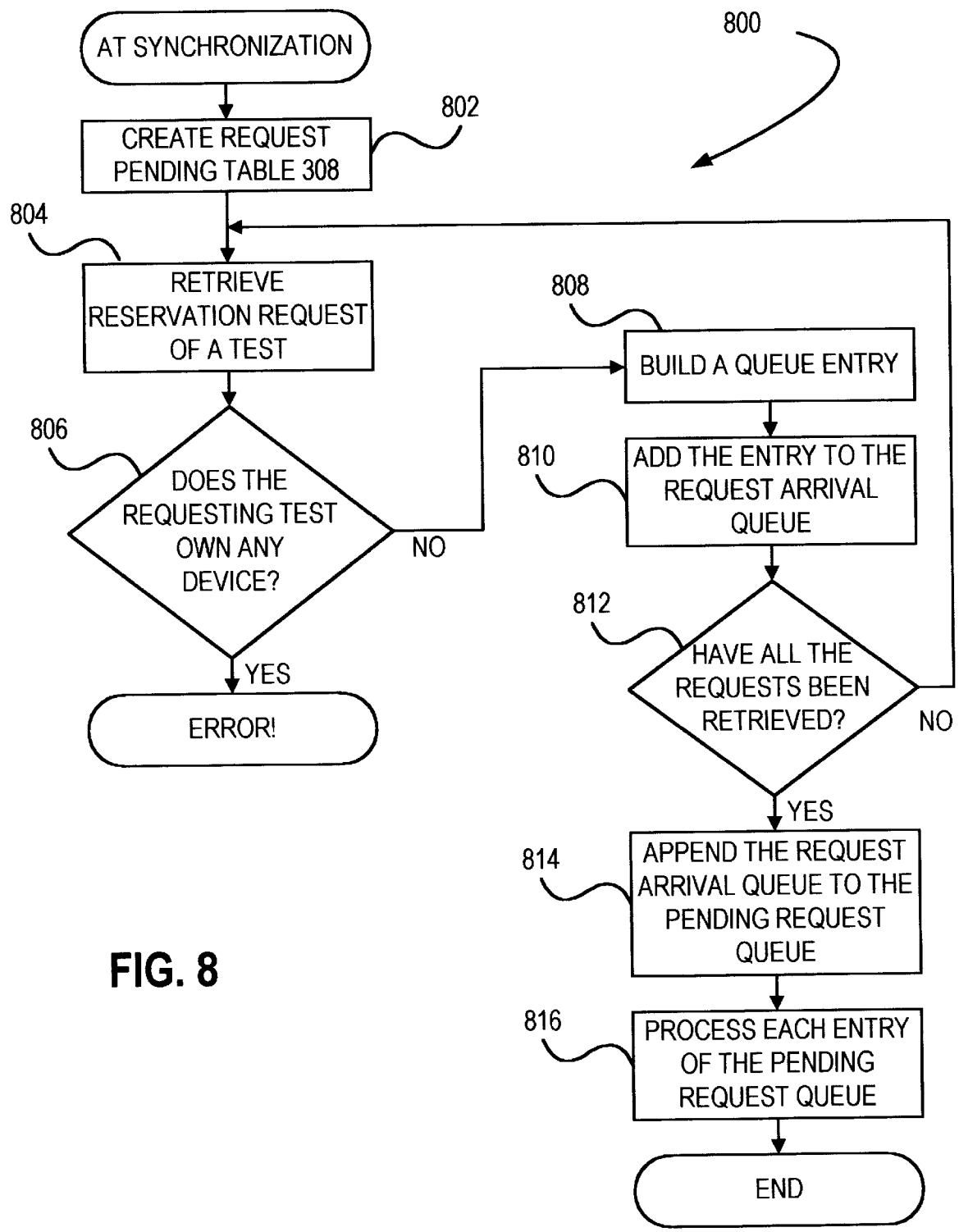
FIG. 8 is a logic flow diagram of the processing of the hub of FIG. 3 in serving requests for reservation of devices by tests of FIG. 1.

Arbitration of various reservation requests by hub 130 is illustrated by logic flow diagram 800 (FIG. 8). Request arrival queue 308 (FIG. 3) does not persist between multiple performances of the steps of logic flow diagram 800 (FIG. 8). Therefore, a new, empty request arrival queue 308 (FIG. 3) is created in step 802 (FIG. 8) in which processing according to logic flow diagram 800 begins. Processing transfers from step 802 to step 804.

In step 804, hub 130 (FIG. 1) retrieves and removes from received request queue 312 (FIG. 3) a reservation request from a test, e.g., test 120A. Processing transfers from step 804 (FIG. 8) to test step 806 in which hub 130 (FIG. 1) determines whether the requesting test, e.g., test 120A, has successfully reserved a device and has not relinquished the reservation. Hub 130 makes such a determination by comparing the number of devices reserved by test 120A, as represented in the requests granted field corresponding to test 120A, to the value zero. For example, if reservation state record 402 (FIG. 4) of reservation state table 304 represents the reservation state of test 120A (FIG. 1), hub 130 compares data stored in requests granted field 402C (FIG. 4) to data whose value is zero. If the number of devices reserved by test 120A (FIG. 1) does not equal zero, an error is detected and processing according to logic flow diagram 800 (FIG. 8) terminates. Thus, a device which has not relinquished reservation of all reserved devices cannot request reservation of additional devices. Conversely, if the number of devices reserved by test 120A (FIG. 1) is equal to zero, processing transfers from test step 806 (FIG. 8) to step 808.

In step 808, hub 130 (FIG. 3) builds a test record, e.g., test record 602 (FIG. 6), which identifies, for example, in test identification field 602A, test 120A (FIG. 1), and which includes a list of device records which identify all of the devices reservation of which is requested by test 120A in step 804 (FIG. 8). In addition, hub 130 (FIG. 3) stores in the reservation requests field corresponding to test 120A (FIG. 1) the number of devices reservation of which test 120A requests. For example, if test identification field 402A (FIG. 4) of reservation status record 402 identifies test 120A (FIG. 1), hub 130 stores in reservation requests field 402B (FIG. 4) data representing the number of devices reservation of which test 120A (FIG. 1) requests. Processing transfers from step 808 (FIG. 8) to step 810 in which hub 130 (FIG. 3) includes in request arrival queue 308 the test record built in step 808 (FIG. 8). Hub 130 (FIG. 3) stores test records in request arrival queue 308 in a specific order according to the test identification fields of the test records of request arrival queue 308. Thus, the relative ordering of test records within request arrival queue 308 is fixed by the particular test identifiers selected for each test. As long as the unique identifiers of the respective test remain unchanged, the order of test records corresponding to particular tests is independent of the order in which the tests posts their reservation requests with hub 130. As a result, arbitration by hub 130 is repeatable. However, if a test design engineer wishes to change the order in which reservation requests are served by hub 130, i.e., to change the result of reservation arbitration by hub 130, the test design engineer can simply change the unique identifiers of each of the tests.

Processing transfers from step 810 (FIG. 8) to test step 812 in which hub 130 (FIG. 1) determines whether all requests for reservation of devices have been posted by the tests registered with hub 130. Hub 130 makes such a determination by determining that received request queue 312 (FIG. 3) is empty. If one or more registered tests have not yet posted requests for reservation of one or more devices, i.e., if received request queue 312 is not empty, processing transfers from test step 812 (FIG. 8) to step 804 in which hub 130 (FIG. 1) retrieves and removes another reservation request of a test such as test 120A. Conversely, if all reservation requests have been retrieved and removed from received request queue 312 (FIG. 3), processing transfers from test step 812 (FIG. 8) to step 814.

In step 814, hub 130 (FIG. 3) appends request arrival queue 308 to pending request queue 310. As a result, request arrival queue 308 ceases to exist as a data structure separate from pending request queue 310. Thus, all test records of request arrival queue 308 are subsequent to test records which are included in pending request queue 310 prior to appending request arrival queue 308 to pending request queue 310 in step 814 (FIG. 8). Hub 130 (FIG. 3) appends request arrival queue 308 to pending request queue 310 as follows. Hub 130 determines the last test record of pending request queue 310, e.g., test record 714 (FIG. 7), and replaces next test record pointer 714C, whose value is NULL, with a pointer to the first test record of request arrival queue 308 (FIG. 6), e.g., test record 602.

Figure 9:
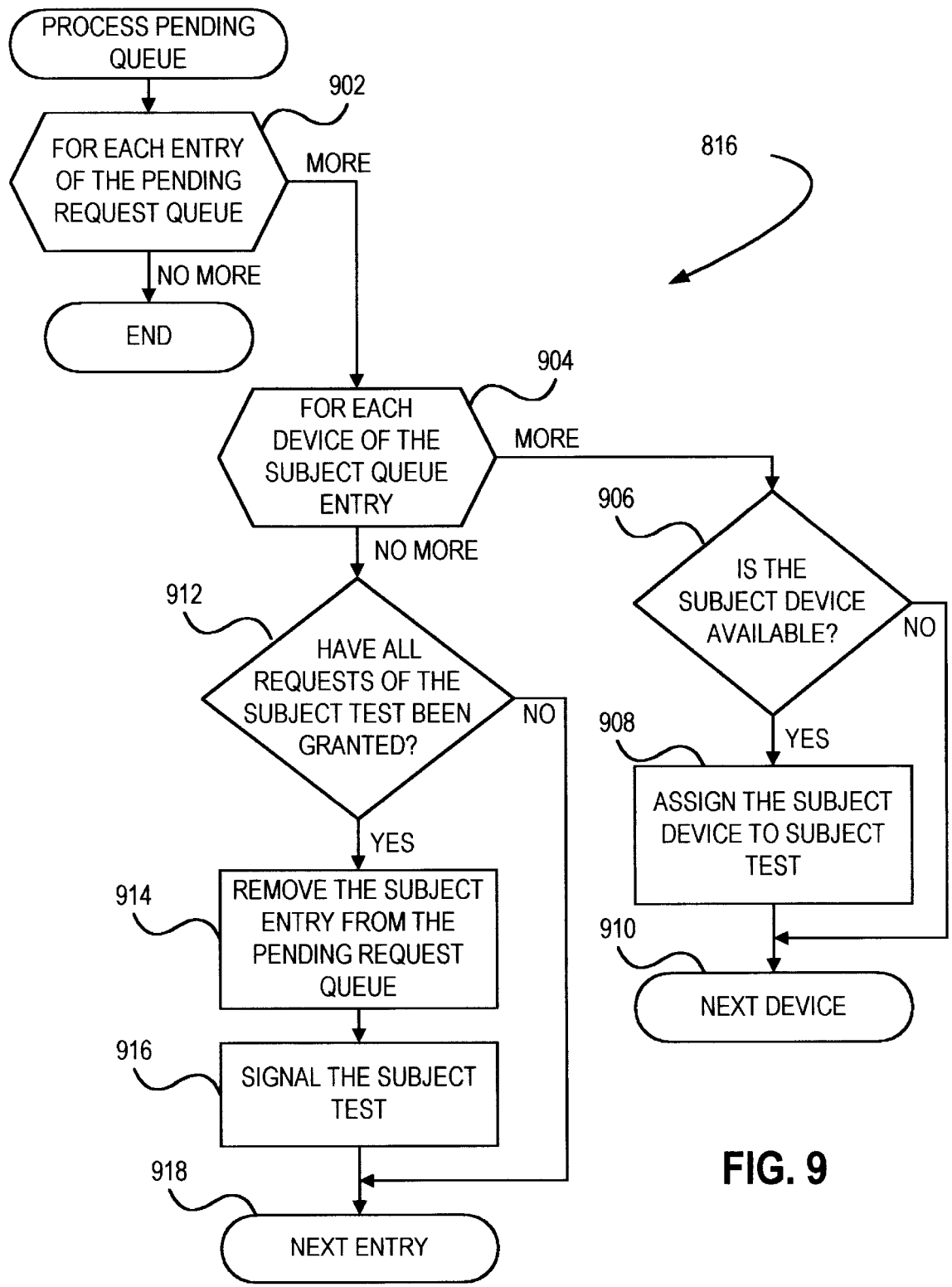
FIG. 9 is a logic flow diagram illustrating in greater detail a step of the logic flow diagram of FIG. 8.

In step 816 (FIG. 8), to which processing transfers from step 814, hub 130 grants as many reservation requests represented in pending request queue 310 (FIG. 3) as possible. Step 816 is shown in greater detail as logic flow diagram 816 (FIG. 9) in which processing begins in loop step 902.

Loop step 902, in conjunction with next step 918, defines a loop in which each test record of pending request queue 310 (FIG. 7) is processed. During an iteration of the loop defined by loop step 902 (FIG. 9) and next step 918, the test record processed is referred to as the subject test record. For each test record of pending request queue 310 (FIG. 7), processing transfers from loop step 902 (FIG. 9) to loop step 904.

Loop step 904, in conjunction with next step 910, defines a loop in which each device record of the list identified by the device list pointer of the subject test record is processed. For example, if the subject test record is test record 706, each of the device records of the list identified by device record list pointer 706B, i.e., device records 708, 710, and 712, is processed in an iteration of the loop defined by loop step 904 (FIG. 9) and next step 910. During an iteration of the loop defined by loop step 904 and next step 918, the device record processed is referred to as the subject device record. For each device record of the list identified by the device list pointer of the subject test record, processing transfers from loop step 904 to test step 906.

In test step 906, hub 130 (FIG. 3) determines whether the subject device is available, i.e., whether the device identified by the subject device record is not reserved by any test. Hub 130 makes such a determination by determining whether the subject device is associated with a valid test identifier in routing table 306. For example, if device identification field 502A of routing record 502 identifies the subject device, hub 130 determines whether test identification field 502B is a valid test identifier. If so, the subject device is currently reserved by a test. Conversely, if test identification field 502B is not a valid test identifier, the subject device is currently available.

If the subject device is available, processing transfers from test step 906 (FIG. 9) to step 908 in which hub 130 (FIG. 3) grants the request of the test corresponding to the subject test record, i.e., the "requesting test" in the context of steps 904–916 (FIG. 9), for reservation of the subject device. For example, hub 130 (FIG. 3) grants the request of the subject test for reservation of the subject device by associating within routing table 306 the test identifier of the subject test with the device identifier of the subject device. For example, if device identification field 502A (FIG. 5) of routing record 502 identifies the subject device, hub 130 (FIG. 3) stores in test identification field 502B the test identifier of the subject test. Reservation of the subject device is thereby granted to the subject test.

In addition, the device record representing the request of reservation of the subject device by the subject test is removed from the list of device records representing pending reservation requests of the subject test in one embodiment. For example, if test record 706 (FIG. 7) of pending request queue 310 is the subject test record and device record 708 identifies the subject device, device record 708 is removed from the list of device records of the subject test record since the request for reservation of the device identified by device record 708 is no longer pending. In this way, hub 130 (FIG. 3) determines that all requests for the subject test have been granted when the subject test record includes no device records. Furthermore, hub 130 (FIG. 3) increments in the requests granted field corresponding to test 120A (FIG. 1) in reservation state table 304 (FIG. 4) the number of devices reservation of which test 120A (FIG. 1) requests. For example, if test identification field 402A (FIG. 4) of reservation status record 402 identifies the subject test, hub 130 (FIG. 3) increments the value of the data stored in requests granted field 402C (FIG. 4) to accurately reflect the number of reservation requests of the subject test granted thus far.

In an alternative embodiment, the device record corresponding to a device which is reserved to the subject test is not removed from the subject test record. In this embodiment, hub 130 (FIG. 3) determines that all reservation requests for the subject test have been granted when the reservation requests field and the requests granted field of the reservation state record corresponding to the subject test, e.g., reservation requests field 402B (FIG. 4) and requests granted field 402C of reservation status record 402, represent equal values.

Processing transfers from step 908 through next step 910 to loop step 904 in which the next device record of the list of requested devices of the subject test record is processed according to the loop defined by loop step 904 and next step 910. In addition, if hub 130 (FIG. 3) determines in test step 906 (FIG. 9) that the subject device is not available, i.e., is reserved by a test other than the subject test, processing transfers from test step 906 through next step 910 to loop step 904, bypassing step 908. When all device records of the list of device records of the subject test record have been processed according to the loop defined loop step 904 and next step 910, processing transfers from loop step 904 to test step 912.

In test step 912, hub 130 (FIG. 3) determines whether all requests for reservation by the subject test have been granted in the manner described above with respect to step 908 (FIG. 9). If all such requests have been granted, the device record list pointer of the subject test record, e.g., device record list pointer 706B (FIG. 7), is a NULL, i.e., the device record list has a length of zero. If less than all such requests have been granted, i.e., if the device record list pointer of the subject test record identifies a device record or, in an alternative embodiment, the number of reservations requested is less than the number of such requests granted as represented in reservation state table 304 (FIG. 4), processing transfers from test step 912 (FIG. 9) through next step 918 to loop step 902 in which the next test record of pending request queue 310 (FIG. 7) is processed according to the loop defined by loop step 902 (FIG. 9) and next step 918. Thus, if a request of a test for reservation of a device is not granted during a reservation phase, the test record corresponding to the test remains in pending request queue 310 (FIG. 3), which persists between reservation phases and between multiple performances of the steps of logic flow diagram 800 (FIG. 8). In addition, execution of such a test remains suspended as described above with respect to step 206 (FIG. 2) of logic flow diagram 200 until at least the next reservation phase. In an alternative embodiment, each test requesting reservations is awakened at the end of each reservation arbitration as described in the context of logic flow diagram 800 (FIG. 8) and each test determines by comparison of the number of reservations requested as represented in reservation state table 304 (FIG. 4) to zero, which indicates all requests have been granted, and determines whether to resume execution based upon the comparison.

Conversely, if all requests of the subject test have been granted, processing transfers from test step 912 (FIG. 9) to step 914. In step 914, hub 130 (FIG. 3) removes the subject test record from pending request queue 310 (FIG. 3). In addition, hub 130 updates the reservation state of the subject test in reservation state table 304. Specifically, if test identification 402A (FIG. 4) identifies the subject test, hub 130 (FIG. 3) stores in reservations requested field 402B (FIG. 4) and requests granted field 402C data whose value is zero. Thus, according to Table A above, the subject test has no reservation requests pending as reflected in reservation state table 304. Processing transfers from step 914 to step 916.

In step 916, hub 130 (FIG. 1) signals the subject test to awaken the subject test as described more completely above with respect to logic flow diagram 200 (FIG. 2). From step 916, processing transfers through next step 918 to loop step 902 in which the next test record of pending request queue 310 is processed according to the loop defined by loop step 902 and next step 918. Once each test record of pending request queue 310 (FIG. 7) is processed according to the loop defined by loop step 902 and next step 918, processing according to logic flow diagram 816, and therefore step 816 (FIG. 8), completes. After completion of step 816, processing according to logic flow diagram 800, and therefore the reservation phase, completes. The tests signaled in various performances of step 916 (FIG. 9) continue to execute until the next synchronization phase while any tests which continue to have pending reservation requests sleep until the next synchronization phase.

As described above, once the subject test is granted all pending requests for reservation of one or more devices and execution of the subject test is resumed, the subject test is not permitted to request reservation of any additional device until reservation of all reserved devices is relinquished in a performance of step 212 (FIG. 2). Thus, all tests identified by test records of request arrival queue 308 (FIG. 6) have reserved no devices. In addition, pending request queue 310 (FIG. 7) is ordered and reservation requests are granted in order in the manner described above. Accordingly, no test identified in a test record appended to pending request queue 310 (FIG. 7) in a particular reservation phase can be waiting for a test identified in a subsequent test record appended to pending request queue 310 in the same reservation phase to relinquish reservation of a device. Since request arrival queue 308 (FIG. 6) is appended to pending request queue 310 (FIG. 7) in step 814 (FIG. 8), no test identified in a test record which remains in pending request queue 310 (FIG. 7) from a prior reservation phase can be waiting for a test identified in a test record appended to pending request queue 310 (FIG. 7) in a subsequent reservation phase to relinquish reservation of a device. Thus, deadlocks are successfully prevented by the device reservation system implemented by hub 130 (FIG. 3).

In addition, since request arrival queue 308 is appended to pending request queue 310 (FIG. 7) in step 814 (FIG. 8), tests which are identified by test records which have been included in pending request queue 310 (FIG. 7) for the most reservation phases are given the highest priority. Starvation is therefore effectively prevented and performance of simulations as orchestrated by hub 130 (FIG. 1) execute efficiently.

Furthermore, arbitration of reservation requests in the manner described above is completely repeatable. Hub 130 (FIG. 1) is guaranteed that all tests which will request reservation of one or more devices make such a request during the same synchronization phase during each iterative execution of the simulation of hub 130 and the tests and simulation systems which communicates through hub 130. However, the specific order in which tests make such requests for reservation during a particular synchronization phase is undetermined. By sorting test records of request arrival queue 308 (FIG. 6), the order in which requests made during a particular synchronization phase are granted is fixed. Since the particular tests which request reservation during a particular synchronization phase do not differ from one execution of the simulation of hub 130 and the tests and simulation systems which communication through hub 130 to another, requests from a previous synchronization phase can be given priority over requests from a subsequent synchronization phase to prevent starvation without affecting the repeatability of the order in which requests for reservation of devices are granted.

The burden imposed upon a test design engineer to design tests which conform to the device reservation mechanism described is minimal. Such tests must initially register with hub 130 (FIG. 1) and must thereafter reserve devices before interacting with those devices. In addition, the tests must relinquish reservation of all reserved devices before requesting additional device reservations. These considerations are few and simple to implement. In observing these few, simple design requirements, a test design engineer can design widely varying tests of the circuit simulated by simulation systems 140A–C and analogous simulation systems executing within computers 100 and 100B–C and can execute such widely varying tests concurrently without concern for deadlock or starvation.

Routing

The reservation mechanism automatically provides a simple mechanism by which messages generated by a device, e.g., a device of any of simulation systems 140A–C, can be routed to the appropriate test. As described above, hub 130 includes a routing table 306 (FIG. 3) which associates device identifiers, e.g., device identifier field 502A (FIG. 5) of routing record 502, with test identifiers, e.g., test identifier field 502B, of tests which have reserved the respective identified devices. Thus, if a device sends a message to hub 130 (FIG. 3), hub 130 simply retrieves from routing table 306 the identifier of the test which has reserved the device and routes the message to that test.

Shared Devices

The above description pertains primarily to devices of simulation systems 140A–C (FIG. 1) which are not shared, i.e., which can be reserved by no more than one test. A second embodiment of routing table 306 (FIG. 5) is shown as device status table 306B in FIG. 10. Device status table 306B does not provide routing information as provided by routing table 306, but does provide information regarding the availability of each device registered with hub 130 (FIG. 3). Device status table 306B (FIG. 10) includes a number of device status records, e.g., device status record 1002. All device status records of device status table 306B are directly analogous to one another and the following description of device status record 1002 is equally applicable to all other device status records of device status table 306B.

Device status record 1002 includes a device identification field 1002A which is directly analogous to device identification field 502A (FIG. 5) described above. In addition, device status record 1002 includes a maximum reservations field 1002B and a number of reservations field 1002C. In registering with hub 130, each device provides to hub 130 information specifying the maximum number of tests which can be allowed to interact with the device at one time. The specified maximum number of tests is recorded by hub 130 in maximum reservations field 1002B and the recorded value remains unchanged as long as the device remains registered with hub 130.

Figure 10:
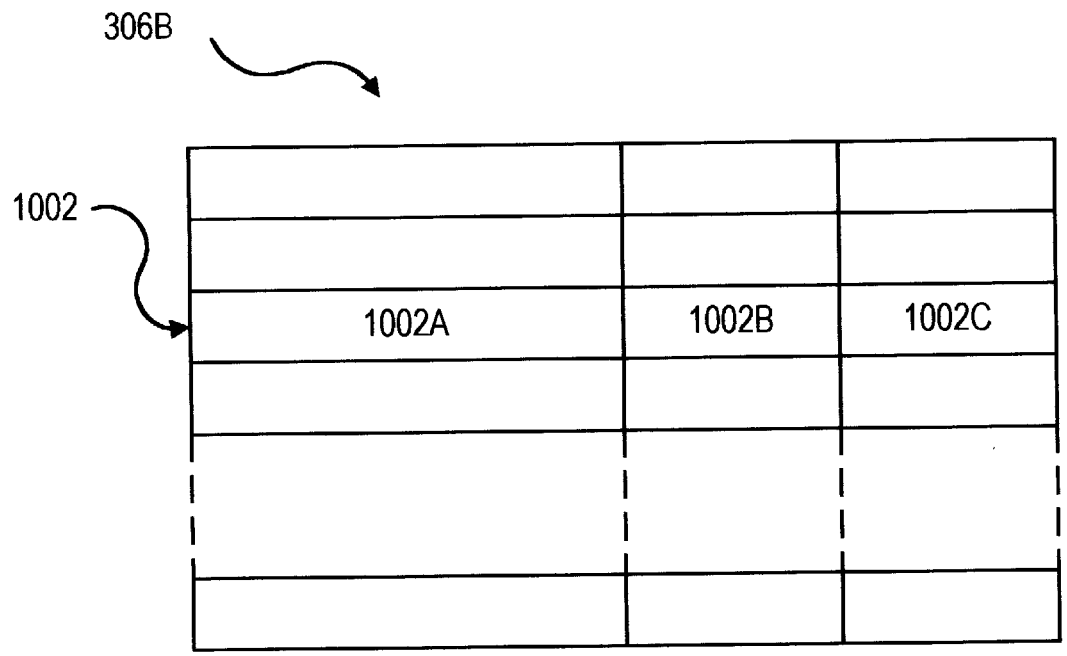
FIG. 10 is a block diagram of a device reservation status table in an alternative embodiment of the hub of FIG. 3.

Number of reservations field 1002C is initialized to represent the value zero as, initially, no test has reserved the device whose reservation state is represented by device reservation status record 1002, which is referred to as the subject device in the context of FIG. 10. Each time a reservation request of the subject device is granted, the value represented in number of reservations field 1002C is incremented. Similarly, each time a reservation of the subject device is relinquished by a test, the value represented in number of reservations field 1002C is decremented. Before granting a request for reservation of the subject device, hub 130 (FIG. 3) compares the values stored in maximum reservations field 1 002B and number of reservations field 1002C and grants the request for reservation only if the number of existing reservations of the subject device as represented in number of reservations field 1002C is less than the maximum allowed reservations of the subject device as represented in maximum reservations field 1002B.

Figure 11:
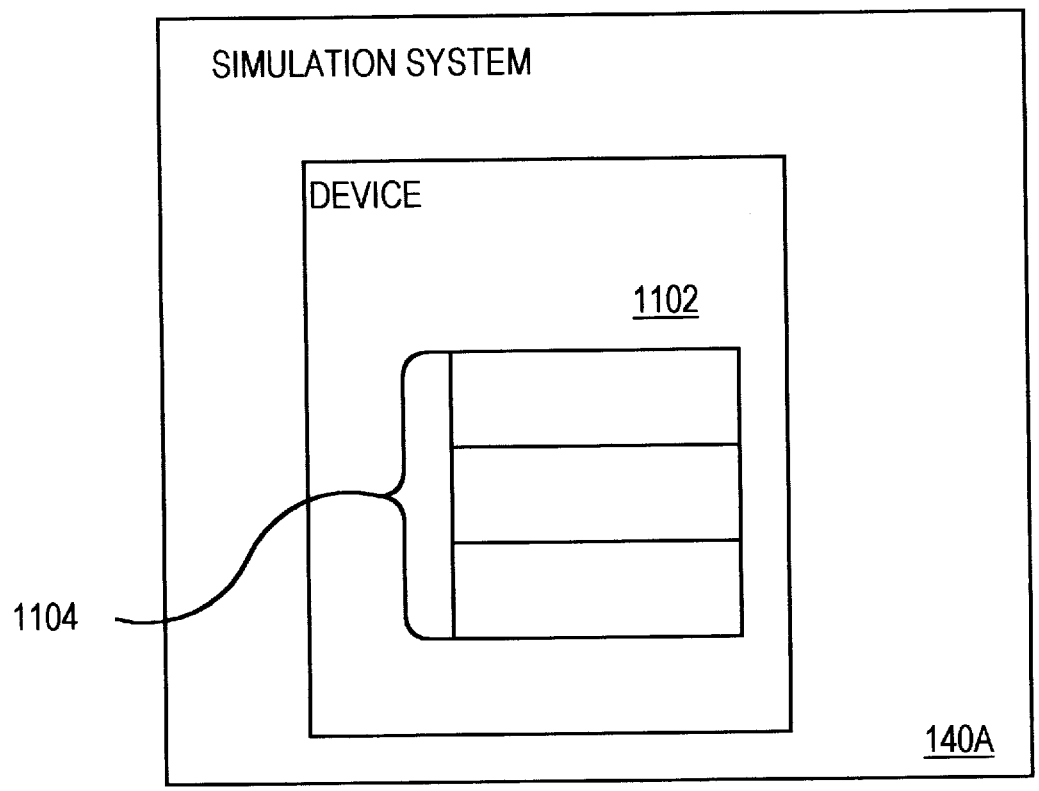
FIG. 11 is a block of a simulation system of FIG. 1 and a device of the simulation system and included routing registers of the device.

As described briefly above, device reservation status table is not used to route messages from the subject device to a test which has reserved the subject device. Instead, each shared device includes one or more routing registers, e.g., routing registers 1104 (FIG. 11) of device 1102 of simulation system 140A. Each test which reserves device 1102 substantially immediately thereafter writes into a selected one of routing registers 1104 the test identifier of the test. Thus, each device maintains routing information which is originally provided by the test to which information is to be sent from the device.

The above description is illustrative only and is not limiting. The present invention is limited only by the claims which follow.

What is claimed is:

1. A method for preventing device access collisions in a distributed simulation executing in one or more computers which are mutually operatively coupled to one another and which includes simulation of one or more concurrently simulated devices and execution of which is controlled by one or more concurrently executing tests, wherein each of the concurrently executing tests can request and acquire reservation of one or more of the one or more concurrently simulated devices, the method comprising:

including in a pending request queue one or more reservation requests from one or more of the concurrently executing tests for reservation of one or more of the concurrently simulated devices and received by a hub of the distributed simulation in two or more sequential reservation phases, wherein each of the sequential reservation phases corresponds to a respective common simulation time of the one or more concurrently executing tests;

ordering within the pending request queue the requests of the reservation phases such that the all requests of a prior one of the reservation phases are positioned within the pending request queue before any request of a subsequent one of the reservation phases; and serving the requests of the pending request queue in accordance with positions of the respective requests within the pending request queue such that all requests of the prior reservation phase are served prior to any request of the subsequent reservation phase.

2. A method for preventing device access collisions in a distributed simulation which includes two or more concurrently simulated devices and two or more concurrently executing tests, wherein each of the concurrently executing tests can request and acquire reservation of one or more of the one or more concurrently simulated devices, the method comprising:

including in a pending request queue requests from one or more of the concurrently executing tests for reservation of one or more of the concurrently simulated devices and received by a hub of the simulation in two or more sequential reservation phases, wherein each of the sequential reservation phases corresponds to a respective common simulation time of the one or more concurrently executing tests; and ordering within the pending request queue the requests of the reservation phases such that the all requests of a prior one of the reservation phases are positioned within the pending request queue before any request of a subsequent one of the reservation phases such that serving the requests in the order of the pending request queue serves all requests of the prior reservation phase prior to serving any request of the subsequent reservation phase.

3. The method of claim 2 further comprising:

ordering within the pending request queue the requests of each of the reservation phases in a repeatable sequence.

4. A method for preventing device access collisions in a distributed simulation which includes two or more concurrently simulated devices and two or more concurrently executing tests, wherein each of the concurrently executing tests can request and acquire reservation of two or more of the two or more concurrently simulated devices, the method comprising performing the following steps in each of two or more reservation phases:

creating a new request arrival queue;

receiving one or more reservation requests from one or more respective ones of the concurrently executing tests for reservation of one or more of the concurrently simulated devices;

including the one or more reservation requests in the request arrival queue such that the request arrival queue contains the one or more requests received in a current one of the reservation phases;

appending the one or more reservation requests of the request arrival queue to a pending request queue such that the one or more requests received in the current reservation phase are positioned within the pending request queue subsequent to any requests of previous ones of the reservation phases; and serving reservation requests of the pending request queue which are included nearer a front of the pending request queue with higher priority than reservation requests which are included further from the front of the pending request queue such that all requests of the previous reservation phases are served prior to the zero or more requests received in the current reservation phase.

5. The method of claim 4 further comprising performing the following step in each of the two or more reservation phases:

ordering within the request arrival queue the one or more reservation requests in a repeatable sequence.

6. A computer program product comprising:

a computer usable medium having computer readable code embodied therein for preventing device access collisions in a distributed simulation executing in one or more computers which are mutually operatively coupled to one another and which includes simulation of two or more concurrently simulated devices and execution of which is controlled by two or more concurrently executing tests, wherein each of the concurrently executing tests can request and acquire reservation of two or more of the two or more concurrently simulated devices, the computer readable code comprising:

a pending request queue module which is configured to include in a pending request queue one or more reservation requests from one or more of the concurrently executing tests for reservation of one or more of the concurrently simulated devices and received by a hub of the distributed simulation in two or more sequential reservation phases, wherein each of the sequential reservation phases corresponds to a respective common simulation time of the one or more concurrently executing tests;

a request ordering module which is operatively coupled to the pending request queue module and which is configured to order within the pending request queue the requests of the reservation phases such that the all requests of a prior one of the reservation phases are positioned within the pending request queue before any request of a subsequent one of the reservation phases; and a reservation request serving module which is operatively coupled to the pending request queue module and which is configured to serve the requests of the pending request queue in accordance with positions of the respective requests within the pending request queue such that all requests of the prior reservation phase are served prior to any request of the subsequent reservation phase.

7. A computer program product comprising:

a computer usable medium having computer readable code embodied therein for preventing device access collisions in a distributed simulation which includes two or more concurrently simulated devices and two or more concurrently executing tests, wherein each of the concurrently executing tests can request and acquire reservation of two or more of the two or more concurrently simulated devices, the computer readable code comprising:

a pending request queue module which is configured to include in a pending request queue requests from one or more of the concurrently executing tests for reservation of one or more of the concurrently simulated devices and received by a hub of the simulation in two or more sequential reservation phases, wherein each of the sequential reservation phases corresponds to a respective common simulation time of the one or more concurrently executing tests; and a request ordering module which is operatively coupled to the pending request queue module and which is configured to order within the pending request queue the requests of the reservation phases such that the all requests of a prior one of the reservation phases are positioned within the pending request queue before any request of a subsequent one of the reservation phases such that serving the requests in the order of the pending request queue serves all requests of the prior reservation phase prior to serving any request of the subsequent reservation phase.

8. The computer program product of claim 7 wherein the computer readable code further comprises:

a phase ordering module which is operatively coupled to the pending request queue module and which is configured to order within the pending request queue the requests of each of the reservation phases in a repeatable sequence.

9. A computer program product comprising:

a computer usable medium having computer readable code embodied therein for preventing device access collisions in a distributed simulation which includes two or more concurrently simulated devices and two or more concurrently executing tests, wherein each of the concurrently executing tests can request and acquire reservation of two or more of the two or more concurrently simulated devices, the computer readable code comprising:

a queue creation module which is configured to create a new request arrival queue in each of two or more reservation phases;

a request retrieval module which is configured to retrieve one or more reservation requests received from one or more respective ones of the concurrently executing tests for reservation of one or more of the concurrently simulated devices in each of the two or more reservation phases;

a request queuing module which is operatively coupled to the queue creation module and to the request retrieval module and which is configured to include the one or more reservation requests in the request arrival queue in each of the two or more reservation phases such that the request arrival queue contains the one or more requests received in a current one of the reservation phases;

a queue appending module which is operatively coupled to the request queuing module for appending the one or more reservation requests of the request arrival queue to a pending request queue in each of the two or more reservation phases such that the one or more requests received in the current reservation phase are positioned within the pending request queue subsequent to any requests of previous ones of the reservation phases; and a reservation request server module which is operatively coupled to the queue appending module and which is configured to serve reservation requests of the pending request queue which are included nearer a front of the pending request queue with higher priority than reservation requests which are included further from the front of the pending request queue in each of the two or more reservation phases such that all requests of the previous reservation phases are served prior to the zero or more requests received in the current reservation phase.

10. The computer program product of claim 9 wherein the computer readable code further comprises:

a queue ordering module which is operatively coupled to the request queuing module and which is configured to order within the request arrival queue the one or more reservation requests in a repeatable sequence in each of the two or more reservation phases.

11. The method of claim 1 wherein the step of ordering comprises:

collecting requests for the subsequent reservation phase into a request arrival queue; and appending the request arrival queue onto the pending request queue which includes requests of the prior reservation phase.

12. The method of claim 1 wherein the step of ordering comprises:

ordering the requests within each of the two or more reservation phases in a repeatable sequence independent of the order in which the requests of each reservation phase are received by the hub.

13. The method of claim 12 wherein the repeatable sequence is derived from unique identifiers of the one or more concurrently executing tests.

14. The method of claim 1 further comprising:

limiting the pending reservation queue to a single request for reservation of one or more concurrently simulated devices for each of the one or more concurrently executing tests.

15. The computer program product of claim 6 wherein the request ordering module comprises:

an arrival queue managing module which is configured to collect requests for the subsequent reservation phase into a request arrival queue; and a pending queue managing module which is operatively coupled to the arrival queue managing module and which is configured to append the request arrival queue onto the pending request queue which in turn includes requests of the prior reservation phase.

16. The computer program product of claim 6 wherein the request ordering module comprises:

a sequencing module which is configured to order the requests within each of the two or more reservation phases in a repeatable sequence independent of the order in which the requests of each reservation phase are received by the hub.

17. The computer program product of claim 16 wherein the repeatable sequence is derived from unique identifiers of the one or more concurrently executing tests.

18. The computer program product of claim 6 further comprising:

a request consolidation module which is configured to limit the pending reservation queue to a single request for reservation of one or more concurrently simulated devices for each of the one or more concurrently executing tests.

* * * * *